(12) United States Patent
Korta et al.

(10) Patent No.: US 12,185,493 B2
(45) Date of Patent: Dec. 31, 2024

(54) COOLING DEVICE AND HEATSINK ASSEMBLY INCORPORATING THE SAME

(71) Applicant: Aptiv Technologies AG, Schaffhausen (CH)

(72) Inventors: Jakub Antoni Korta, Cracow (PL); Volker Klink, Hennef (DE)

(73) Assignee: Aptiv Technologies AG, Schaffhausen (CH)

( * ) Notice: Subject to any disclaimer, the term of this patent is extended or adjusted under 35 U.S.C. 154(b) by 204 days.

(21) Appl. No.: 17/662,991

(22) Filed: May 11, 2022

(65) Prior Publication Data

US 2022/0377935 A1 Nov. 24, 2022

(30) Foreign Application Priority Data

May 24, 2021 (EP) .................................... 21175508

(51) Int. Cl.
*H05K 7/20* (2006.01)

(52) U.S. Cl.
CPC ..... *H05K 7/20145* (2013.01); *H05K 7/20154* (2013.01); *H05K 7/20172* (2013.01); *H05K 7/20436* (2013.01)

(58) Field of Classification Search
CPC . G06F 1/20; G06F 1/203; G06F 1/206; H01L 23/34; H01L 23/345; H01L 23/36; H01L 23/367; H01L 23/3672; H01L 23/3675; H01L 23/3677; H01L 23/373; H01L 23/40; H01L 2023/4037; H01L 2023/4056; H05K 7/20; H05K 7/20009; H05K 7/20127; H05K 7/20136; H05K 7/20145; H05K 7/20154; H05K 7/20163; H05K 7/20172

USPC ......... 361/679.46–49, 679.55–56, 688–710, 361/714–723; 257/706–707, 712–713, 257/717–722; 165/80.2–80.3, 120–126, 165/185; 174/15.1–15.2, 16.1–16.3

See application file for complete search history.

(56) References Cited

U.S. PATENT DOCUMENTS

| 5,409,352 A | * | 4/1995 | Lin ....................... | F04D 29/582 257/722 |
| 5,522,700 A | * | 6/1996 | Hong .................... | F04D 29/582 165/122 |
| 5,816,319 A | * | 10/1998 | Kamekawa ........... | F04D 29/424 257/E23.083 |
| 5,896,917 A | | 4/1999 | Lemont et al. | |
| 6,157,539 A | * | 12/2000 | Wagner ................. | H01L 23/467 174/16.3 |

(Continued)

OTHER PUBLICATIONS

"Extended European Search Report", EP Application No. 21175508. 7, Nov. 24, 2021, 10 pages.

*Primary Examiner* — Adrian S Wilson
*Assistant Examiner* — Gage Crum
(74) *Attorney, Agent, or Firm* — Harness, Dickey & Pierce, P.L.C.

(57) ABSTRACT

This document describes a cooling device for cooling a heatsink having a plurality of cooling fins provided on a heatsink base. The cooling device includes a centrifugal fan having a fan inlet and a fan outlet, a support for mounting the fan above the heatsink, and a baffle locatable between the support and the heatsink base. The baffle defines an inlet pathway for feeding air between the cooling fins over the heatsink base to the fan inlet and an outlet pathway for expelling air from the fan outlet.

19 Claims, 7 Drawing Sheets

(56) References Cited

U.S. PATENT DOCUMENTS

| | | | | |
|---|---|---|---|---|
| 6,196,302 | B1* | 3/2001 | Chuang | H05K 7/20172 |
| | | | | 165/122 |
| 6,543,522 | B1* | 4/2003 | Hegde | H01L 23/467 |
| | | | | 174/16.3 |
| 6,549,404 | B1* | 4/2003 | Kitahara | H01L 23/467 |
| | | | | 257/E23.102 |
| 6,622,786 | B1* | 9/2003 | Calmidi | H01L 23/3677 |
| | | | | 165/122 |
| 7,237,599 | B2* | 7/2007 | Lopatinsky | H01L 23/467 |
| | | | | 165/122 |
| 7,584,780 | B1* | 9/2009 | Lemont | H01L 23/467 |
| | | | | 165/125 |
| 8,240,997 | B2 | 8/2012 | Shirahama et al. | |
| 11,859,915 | B1* | 1/2024 | Azar | H05K 7/20145 |
| 2003/0072135 | A1* | 4/2003 | Lonergan | H01R 12/721 |
| | | | | 361/709 |
| 2005/0145365 | A1* | 7/2005 | Chang | F28F 13/00 |
| | | | | 257/E23.099 |
| 2008/0226446 | A1 | 9/2008 | Fujieda | |
| 2010/0243229 | A1* | 9/2010 | Liu | B21D 53/085 |
| | | | | 165/185 |
| 2011/0051369 | A1* | 3/2011 | Takahara | H05K 7/2099 |
| | | | | 361/695 |
| 2011/0100609 | A1* | 5/2011 | Tang | H05K 7/20318 |
| | | | | 165/185 |
| 2012/0061127 | A1* | 3/2012 | Fields | H01L 23/373 |
| | | | | 29/832 |
| 2013/0250515 | A1* | 9/2013 | Wu | H05K 7/20154 |
| | | | | 361/692 |
| 2014/0219835 | A1 | 8/2014 | De Filippis | |
| 2016/0341492 | A1* | 11/2016 | Wantanabe | H01L 23/3677 |
| 2019/0195230 | A1 | 6/2019 | Inouchi et al. | |
| 2022/0240413 | A1* | 7/2022 | Saaidi | G06F 1/20 |

\* cited by examiner

COOLING DEVICE AND HEATSINK ASSEMBLY INCORPORATING THE SAME

CROSS-REFERENCE TO RELATED APPLICATION

This application claims priority to European Patent Application Number 21175508.7, filed May 24, 2021, the disclosure of which is hereby incorporated by reference in its entirety.

BACKGROUND

Electronic controllers are important devices in modern vehicles. Automotive controllers are often densely packed with electronic components and such components are prone to generating large amounts of heat when in operation.

Within such architectures, if the electronic components are not sufficiently cooled, they can become overheated, which can compromise their operation and lead to premature degradation. Accordingly, cooling devices are typically an essential requirement of electronic architectures within vehicles.

In this respect, for air cooled arrangements, centrifugal fans are often used because of their capacity to produce high pressure flows, which allow air to be driven through complex airflow pathways, which in turn produce high pressure losses. The centrifugal fan may thereby produce high flow rates over the surface of the housing for efficiently removing heat from the electronic controller housed underneath. Within such arrangements, the housing is provided with a number of cooling fins that surround the fan to enhance the heat exchange. As such, the housing functions as a heatsink.

Figure 1:
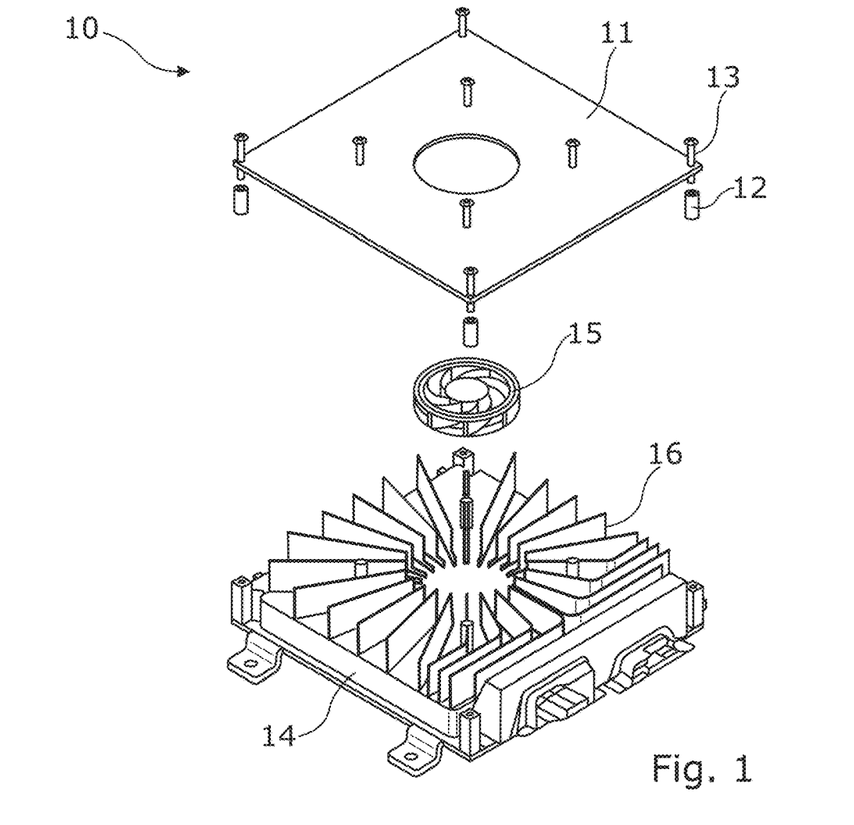
FIG. 1 is an exploded view of a prior art cooling apparatus.

In this respect, FIG. 1 shows an exploded view of a prior art cooling assembly 10 for an electronic controller. The cooling assembly 10 includes an electronic controller housing 14 which is fitted over the automotive electronic controller and forms a heatsink for the components thereof. A plurality of cooling fins 16 are provided over the upper cooling surface of the base of the housing 14 to improve heat transfer. A centrifugal fan 15 is secured to the housing 14 at a central clearing between the radially distributed cooling fins 16. A cover 11 is secured over the cooling fins 16 to define a cooling enclosure and incorporates a central aperture, which locates above the impeller of the fan 15 to define an inlet. The cover 11 is fixed to the housing 14 by a plurality of fasteners 13 which extend through spacers 12.

Figure 2:
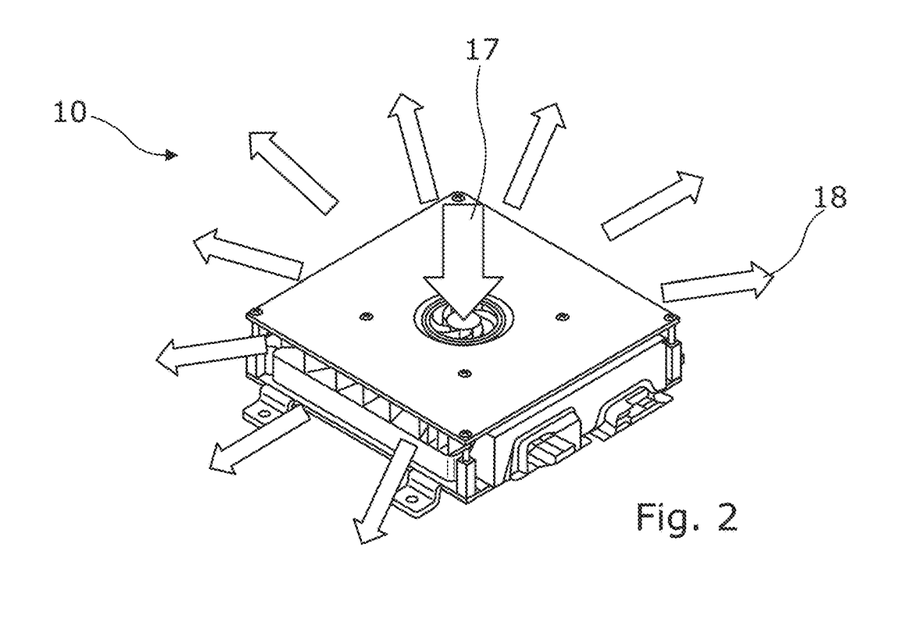
FIG. 2 is an isometric view of the apparatus of FIG. 1 showing the inlet and outlet air flows.

As shown in the isometric schematic view of FIG. 2, when the above arrangement is in use, air is drawn through the aperture provided in the cover 11, into the fan 15 from a vertical direction 17, in line with the axis of rotation of the impeller. The fan 15 then forces the air out perpendicularly to the axis of rotation of the impeller. As such, air is driven rapidly through the outlet pathways between the cooling fins transferring heat away from the fin surfaces. However, there are a number of problems with this existing arrangement.

Firstly, the area for heat exchange is limited by the space required for mounting the centrifugal fan 15. That is, the area directly beneath the centrifugal fan 15 is subjected to a limited cooling effect because incoming air is driven laterally away from the center. Furthermore, as larger, more powerful fans are used to improve cooling, a greater area of the housing is left without effective cooling because of the presence of the fan.

Additionally, the height of the controller housing 14, and in particular, the height of the cooling fins 16, is limited by the need for an air gap above the cover 11. This is necessary to allow air to be freely drawn from the surroundings into the centrifugal fan 15 and consequently, heights are restricted when the assembly is intended for use in tight mounting locations, as is common in the automotive sector. Herein, the necessarily smaller cooling fins have a limiting effect on the overall cooling efficiency of the centrifugal fan.

Furthermore, unwanted heating of the controller housing can also occur due to the contact and close proximity of the fan motor. The operation of the fan motor, particularly at high speeds, can produce significant amounts of thermal energy that is conducted to the controller housing. This may cause its local temperature to rise, partially counteracting the cooling effect of the generated airflow.

To address the above problems, solutions have been proposed which substitute the centrifugal fans for axial fans mounted at the outer periphery of the housing. However, such solutions introduce new drawbacks in that they are not able to generate sufficient air pressure individually and hence require multiple fans and/or larger assemblies. This leads to increased costs and necessitates extensive redesigns of existing arrangements.

In view of the above, there remains a need for a compact arrangement that provides efficient cooling to an electronic controller.

SUMMARY

According to a first aspect, there is provided an apparatus for cooling a heatsink having a plurality of cooling fins provided on a heatsink base, the cooling device including a centrifugal fan having a fan inlet and a fan outlet; a support for mounting the fan above the heatsink base; and a baffle locatable between the support and the heatsink base for defining an inlet pathway for feeding air between the cooling fins over the heatsink base to the fan inlet and an outlet pathway for expelling air from the fan outlet.

In this way, cooling air flow may be directed over the entire heatsink base, including the area directly below the fan. Furthermore, as the fan is not directly mounted to the heatsink, heat dissipated by the operation of the fan motor is not directly transferred to the heatsink, thus improving its overall cooling performance.

Additionally, the proposed solution may also allow for greater installation flexibility in automotive applications. That is, as both the inlet air pathway and outlet air pathway may flow perpendicular to the fan rotation direction, no air gap is required above the support. This may allow the assembly to be mounted in tighter locations than would otherwise be possible.

In embodiments, at least one of the supports and baffles includes metal or plastic. Metal may provide for a higher cooling performance due to its high thermal conductivity. Conversely, plastic baffles may provide for a lightweight and cost-effective construction. In embodiments, the support forms a top baffle. In embodiments, the baffle is metal, and the support is plastic. In such a case, the metal baffle will enhance cooling system performance, while the support baffle provides lightweight structural support and flow guidance.

In embodiments, the heatsink forms a housing for an electronic controller.

In embodiments, the baffle is a plate which includes a plurality of cut-outs for receiving the cooling fins.

In embodiments, the cut-outs are shaped for seating onto seating formations provided on the cooling fins for supporting the baffle.

In embodiments, the cut-outs are shaped for forming a press-fit interface against the cooling fins for securing the baffle to the cooling fins. In this way, an air-tight seal may be formed for preventing air from circulating between the inlet pathway and the outlet pathway.

In embodiments, the baffle further includes an airflow guide provided at a lateral periphery and includes an inclined face for directing air from the outlet pathway away from the inlet pathway. In this way, the risk of heated air expelled from the outlet pathway being recirculated back though the inlet pathway is minimized.

In embodiments, the baffle further includes an aperture into which the fan is received such that the baffle is located between the fan inlet and the fan outlet. In this way, the fan inlet and fan outlet may be separated by the baffle. The baffle aperture may form a seal around the fan.

In embodiments, the support includes a planar mounting surface and wherein the fan is mounted to the planar mounting surface such that the fan inlet is positioned distally to the support. In this way, there is no need to provide an inlet hole in the support, and hence the space above the support can be utilized. As a consequence, taller cooling fins may also be accommodated, thereby improving the cooling performance.

In embodiments, at least one of the inlet pathways and the outlet pathways include a plurality of channels. The channels may be defined between the plurality of cooling fins.

According to a second aspect, there is provided a heatsink assembly for an electronics controller including a heatsink base; a plurality of cooling fins provided on the heatsink base; a support; a centrifugal fan mounted to the support above the heatsink base, the centrifugal fan having a fan inlet and a fan outlet; and a baffle located between the support and the heatsink base and defining an inlet pathway for feeding air between the cooling fins over the heatsink base to the fan inlet and an outlet pathway for expelling air from the fan outlet.

In embodiments, the cooling fins cover the entire surface of the heatsink base. In this way, the region directly below the fan may be provided with a cooling airflow.

In embodiments, the heatsink base includes a cooling surface, and wherein the cooling fins project perpendicular to the cooling surface, and wherein the baffle and support are located in planes parallel to the cooling surface.

In embodiments, the cooling fins include a reduced height region into which the fan is received.

In embodiments, the heights of cooling fins located at a radial extremity of the heatsink base are equal to the distance between the heatsink base and the support. In this way, the entire space available is utilized by the cooling fins to form cooling channels.

In embodiments, the support engages with an apex of one or more of the plurality of cooling fins.

In embodiments, the cooling fins include seating formations for supporting the baffle. In this way, the baffle may be seated mid-height of the cooling fins, and the channel size may be varied depending on the position of the seating formations.

In embodiments, the baffle is secured to the cooling fins by at least one of a heat-conductive adhesive or by a press-fit engagement.

BRIEF DESCRIPTION OF THE DRAWINGS

Illustrative embodiments will now be described with reference to the accompanying drawings in which.

DETAILED DESCRIPTION

The present disclosure relates to an apparatus and, in particular, a cooling device for cooling an electronics housing. The present disclosure is particularly relevant to a cooling device for an automotive electronic controller. The present disclosure also relates to a heatsink assembly incorporating such a cooling device.

Figure 3A:
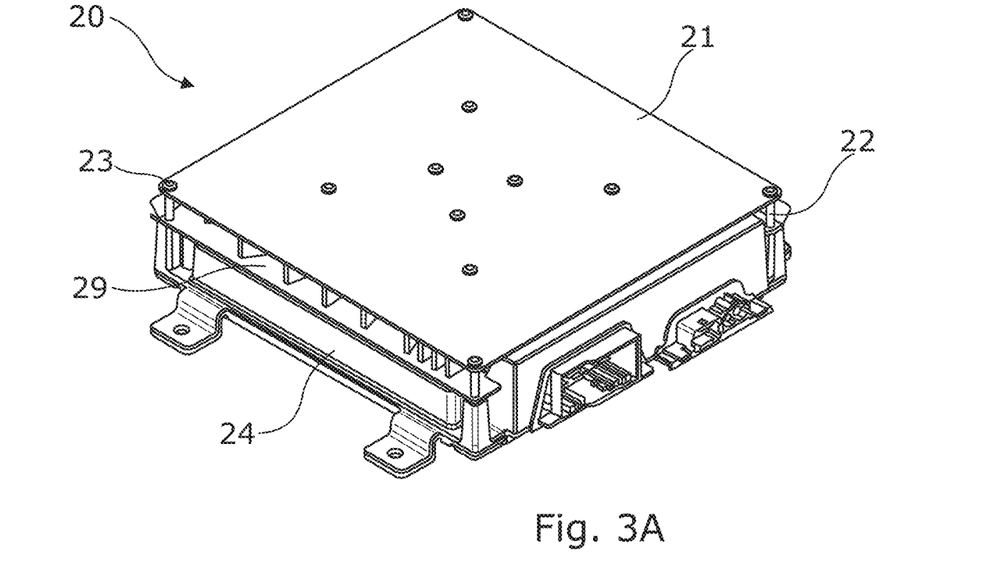
FIG. 3A is an isometric view of a heatsink assembly according to an illustrative embodiment.

FIG. 3A shows an isometric view of an automotive heatsink assembly 20 according to an illustrative embodiment. The heatsink assembly 20 forms an electronic controller housing for enclosing and cooling an electronic controller.

Figure 3B:
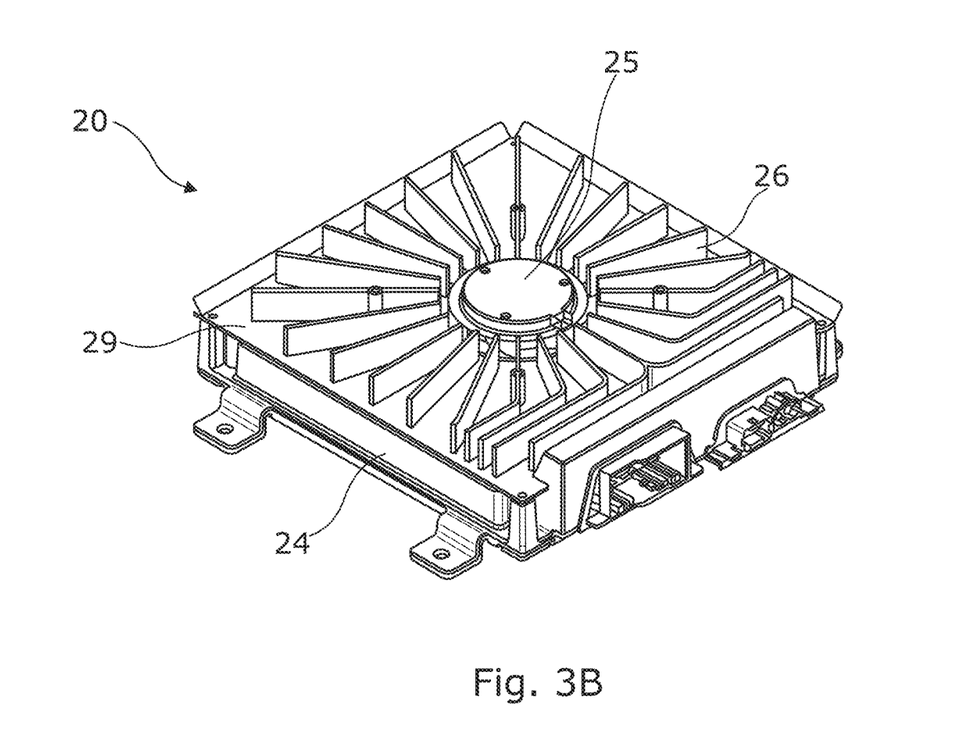
FIG. 3B is an isometric view of the heatsink assembly of FIG. 3A, without the support.
Figure 4A:
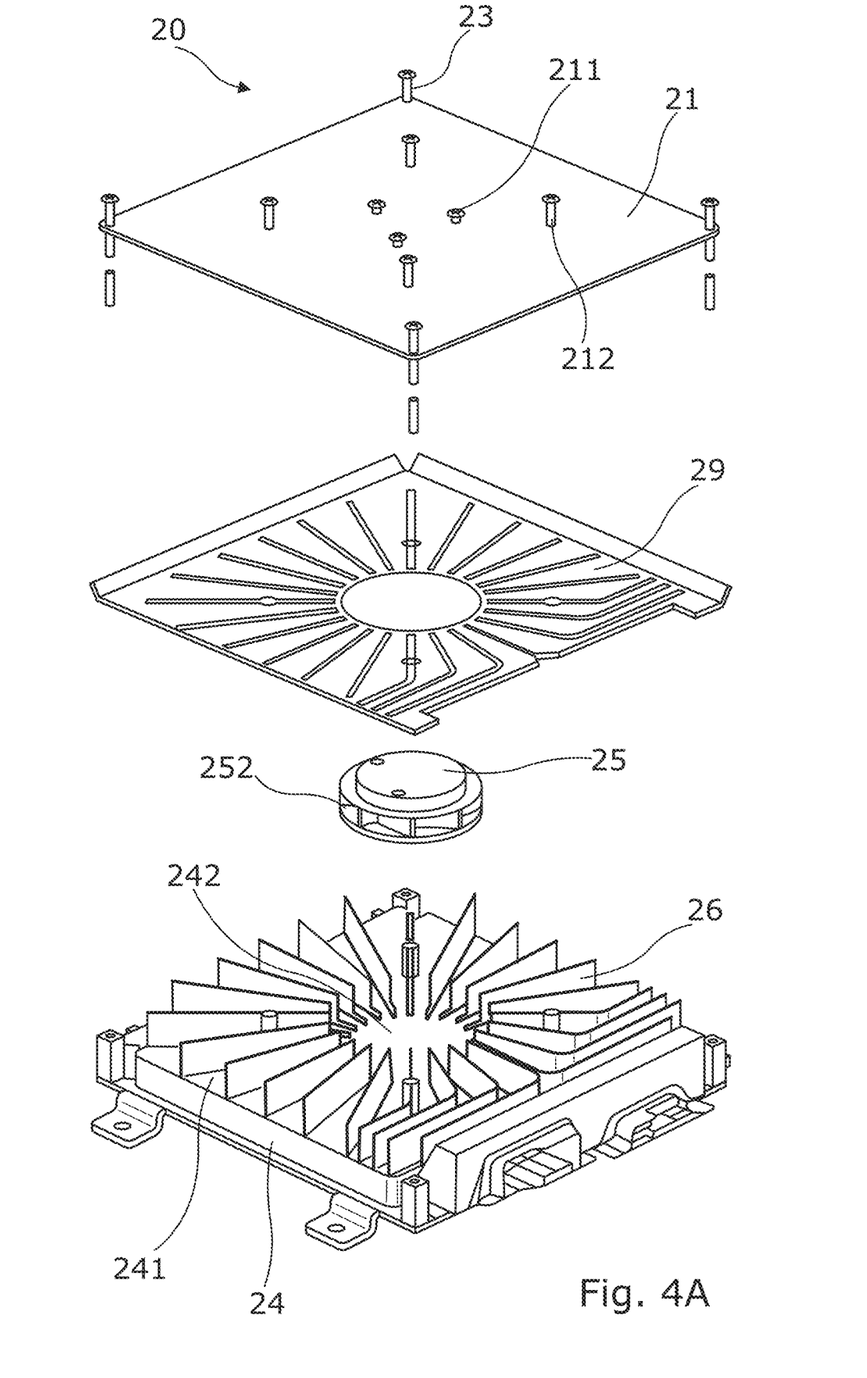
FIG. 4A is an exploded view of the heatsink assembly of FIG. 3A.
Figure 4B:
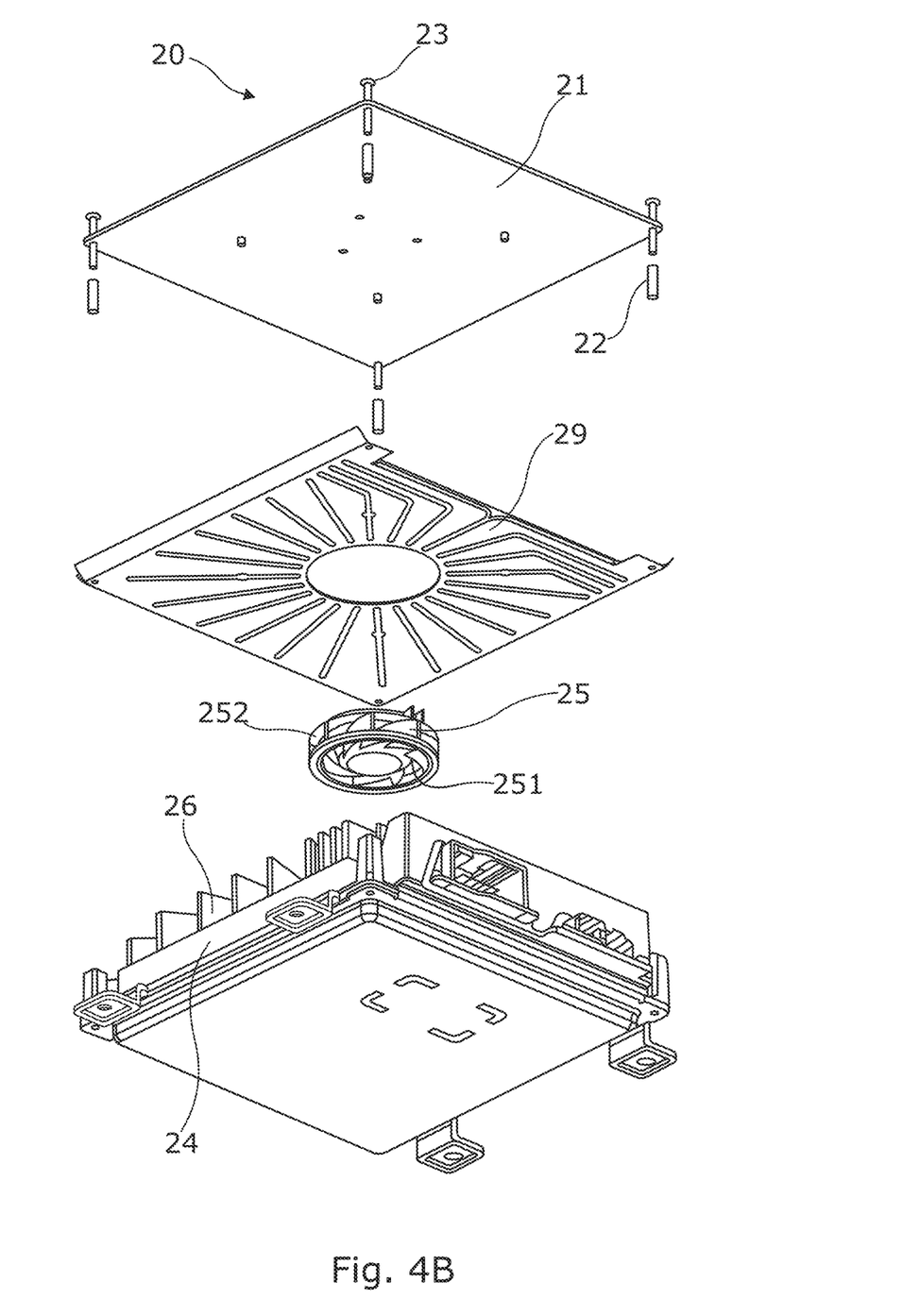
FIG. 4B shows an underside exploded view of the heatsink assembly of FIG. 3A.

FIG. 3B shows an isometric view of the heatsink assembly 20 shown in FIG. 3A, with a cover 21 removed to expose the parts of the heatsink assembly 20. FIGS. 4A and 4B show exploded views of the parts. As shown, the heatsink assembly 20 includes a heatsink 24, which forms the body of the controller housing. As shown most clearly in FIG. 4A, a plurality of cooling fins 26 are provided on an upper surface of the heatsink base 241 of the heatsink and this forms the main cooling surface of the heatsink. The cooling fins 26 extend perpendicularly up from the plane of the heatsink base 241 and form a radial pattern over the surface of the heatsink base 241, extending out from a central clearing 242.

A centrifugal fan 25 is provided having an inlet 251 and an outlet 252. The fan 25 is mounted to the underside of a cover 21 using fasteners 211. The cover 21 is provided as a continuous plate that sits onto the top apexes of the cooling fins 26. The cover 21 thereby forms a roof over the heatsink 24, as shown in FIG. 3A, providing a top baffle over the cooling fins 26. The cover 21 also forms a support for mounting the fan above the base of the heatsink 24, with the fan inlet opposing the heatsink base 241. The cover 21 is fixed using a plurality of fasteners 23, which are received into mounts provided on the heatsink 24. A plurality of spacers 22 are fitted around the fixtures at the periphery of the assembly and serve to brace the cover 21 in line with the tops of the cooling fins 26.

Figure 5:
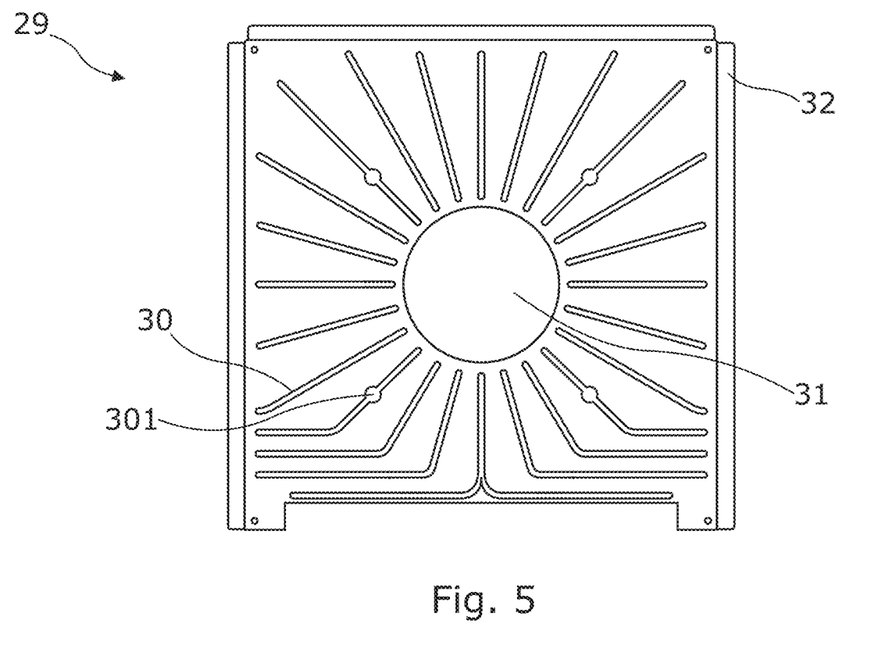
FIG. 5 is a top view of a baffle plate used in the illustrative embodiment.

A baffle 29 is provided between the heatsink base 241 and the cover 21. FIG. 5 shows a top view of the baffle 29. The baffle 29 is provided as a plate-like body including a plurality of cut-outs 30 which correspond to the cooling fins 26 provided on the heatsink 24. The cooling fins 26 are sized to partially receive the fins for allowing the baffle 29 to sit in a plane below the apexes of the fins, between the heatsink base 241 and the cover 21, with the cut-outs 30 sealing around the cooling fins 26. Mount holes 301 are similarly provided in the cut-outs 30 for fitting over the cover mountings provided on the heatsink base 241.

A central fan aperture 31 is provided in the baffle 29 for receiving the centrifugal fan 25. As such, the fan 25 extends down from its mounting on the cover 21, extending partially through the fan aperture 31. The fan aperture 31 is sized to seal around the outer periphery of the fan's body to separate the fan inlet 251 from the fan outlet 252. The baffle 29 further includes airflow guides 32 provided on the three exposed sides of the assembly, with the fourth side including a recess for fitting around a cable terminal access. The airflow guides 32 include an upwardly inclined surface at the lateral extremity of the baffle 29 and are thereby configured to direct air flowing over the upper surface of the baffle away from the heatsink 24.

Figure 6:
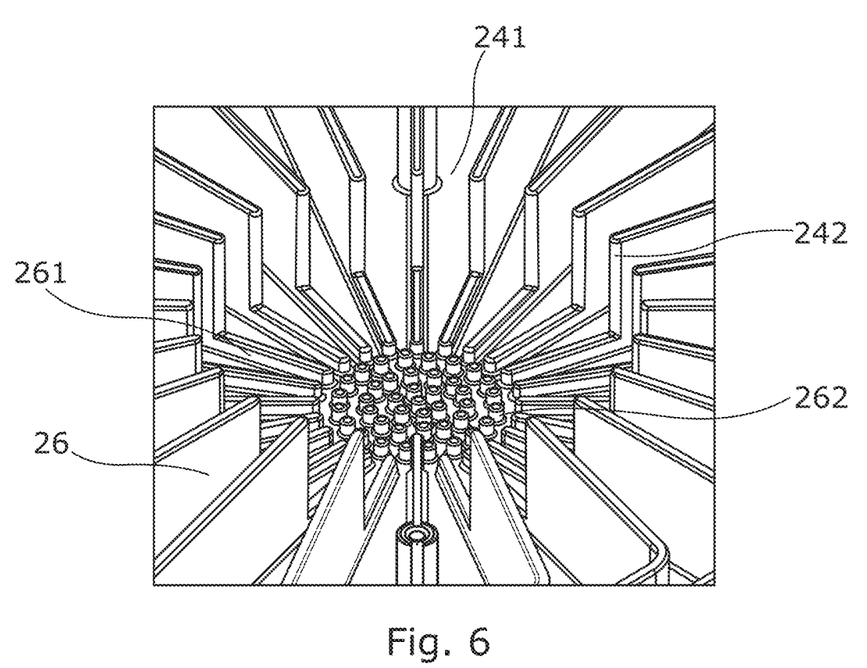
FIG. 6 is an isometric view of the cooling fins and central clearing in the illustrative embodiment.

FIG. 6 is an isometric view of the central region of the heatsink 24 and shows the configuration of the cooling fins 26 around the central clearing 242. As shown, the height of the cooling fins 26 in the central clearing 242 is reduced to form a space for receiving the fan 25. That is, the cooling fins 26 are provided with shortened sections 261 in the region of the heatsink base 241 directly under where the centrifugal fan 25 is mounted to the cover 21. As the fins extend radially out, the shortened sections 261 transition to the fins 26 normal height. The center of the central clearing 242, which sits beneath the rotor of the fan, is provided with short projections 262 for maximizing the surface area for heat transfer over this region of the heatsink 24.

Figure 7A:
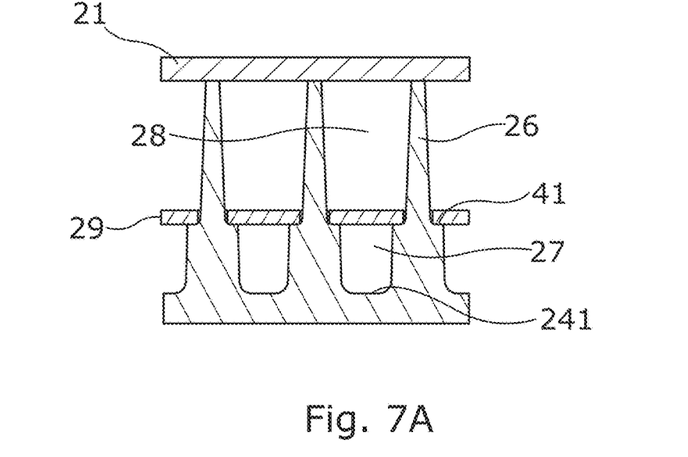
FIG. 7A is a cross-sectional view of the arrangement of the baffle and cooling fins according to the illustrative embodiment.

As mentioned above, the baffle 29 is configured to receive the cooling fins 26 through the cut-outs 30 such that the baffle 29 sits mid-height between the heatsink base 241 and the cover 21, below the apexes of the cooling fins 26. This arrangement can be more clearly seen in FIG. 7A. As shown, the cooling fins 26 are provided with a shoulder 41, which forms a seat for supporting the bottom surface of the baffle 29 between the heatsink base 241 and the cover 21. In this embodiment, the baffle 29 is held in this seated position by the clamping action of the spacers 22 and fasteners 23 against the mounting of the heatsink 24. Once seated, the baffle 29 is mated to the cooling fins 26 forming separated lower inlet channels 27 and upper outlet channels 28. That is, between each fin 26, an inlet channel 27 is defined between the heatsink base 241 and the bottom surface of the baffle 29, and an outlet channel 28 is defined between the top surface of the baffle 29 and the bottom surface of the cover 21. The mating between the baffle 29 and the fins 26 restricts mixing of airflows between the inlet and outlet channels 27, 28.

Figure 7B:
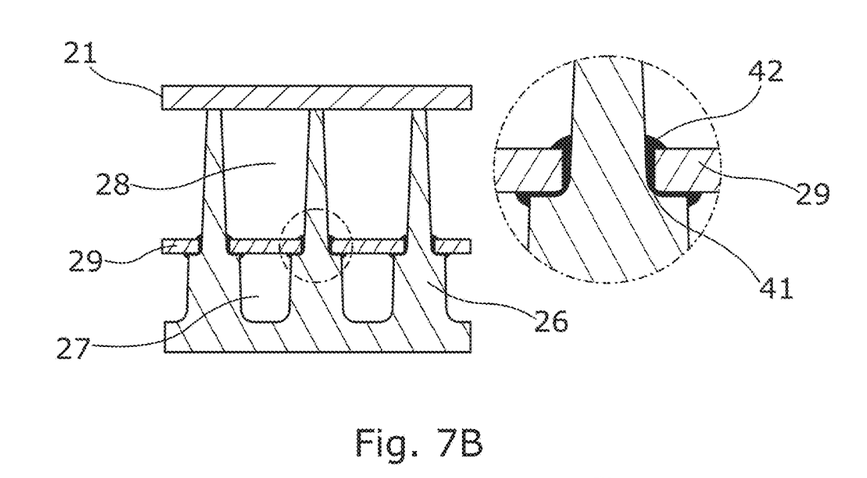
FIG. 7B is a cross-sectional view of the baffle and cooling fins according to a further embodiment.
Figure 7C:
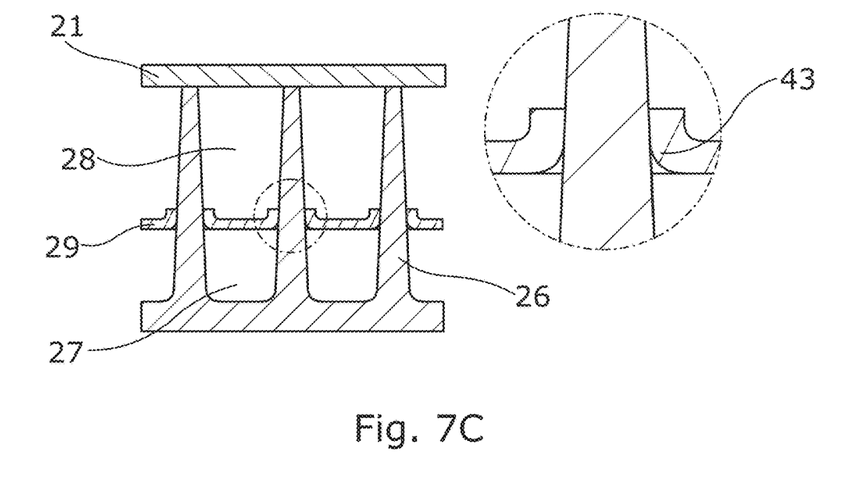
FIG. 7C is a cross-sectional view of the baffle and cooling fins according to another further embodiment.

In this connection, FIGS. 7B and 7C show alternative embodiments where the mating between the baffle 29 and the fins 26 is enhanced. FIG. 7B shows an embodiment where a heat conductive adhesive 42 is applied at the interface between the collar 41 and the baffle 29 to improve the integrity of the air-tight seal between the inlet and outlet channels 27, 28. FIG. 7C shows an embodiment where the edges of the cut-outs 30 are provided with a flange 43 for forming a press fit engagement with the opposing surface of the fin 26. Once engaged together, an interference fit is formed between the fins 26 and the baffle 29, which acts to hold the baffle in place by friction and helps to maintain an air-tight seal between the inlet and outlet channels 27, 28. With this configuration, the fins do not require a shoulder formation for engaging with the baffle 29.

Figure 8A:
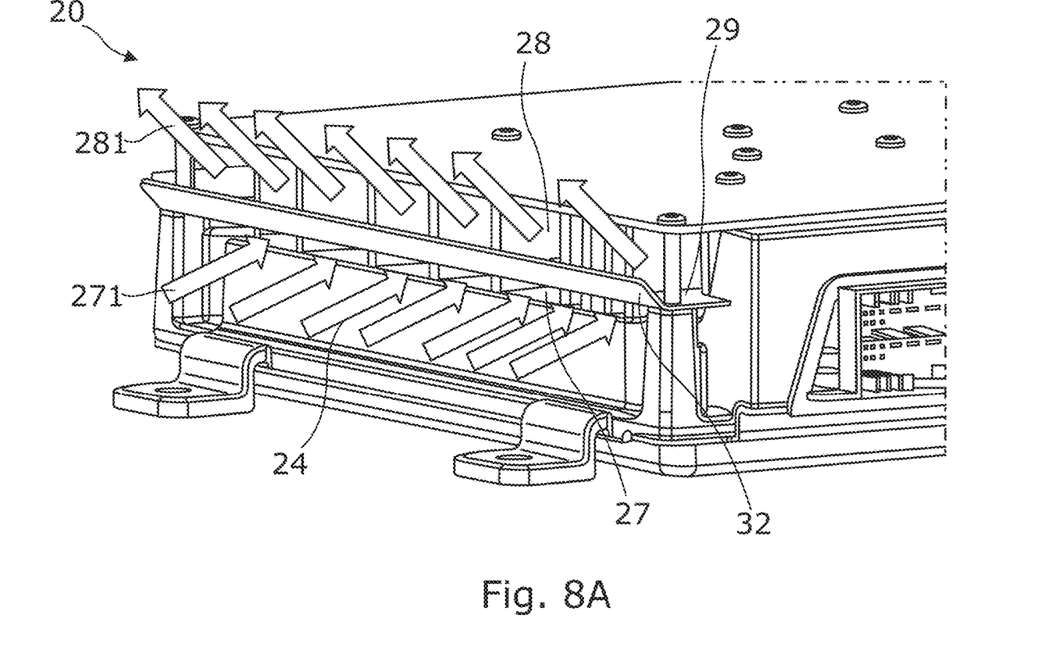
FIG. 8A is an isometric view showing a lateral face of the heatsink assembly according to the illustrative embodiment.

FIG. 8A shows an isometric view of a lateral face of the assembled heatsink assembly 20 according to the illustrative embodiment. As shown, the heatsink 24, baffle 29, and cover 21 form a layered assembly interposed with the inlet and outlet air channels 27, 28. As such, an inlet airflow 271 is drawn in through the inlet channels 27 by the fan 25. At the same time, an outlet airflow 281 is driven out of the outlet channels 28 by the fan 25. The airflow guide 32 acts to divert the expelled outlet airflow 281 away from the assembly 20.

Figure 8B:
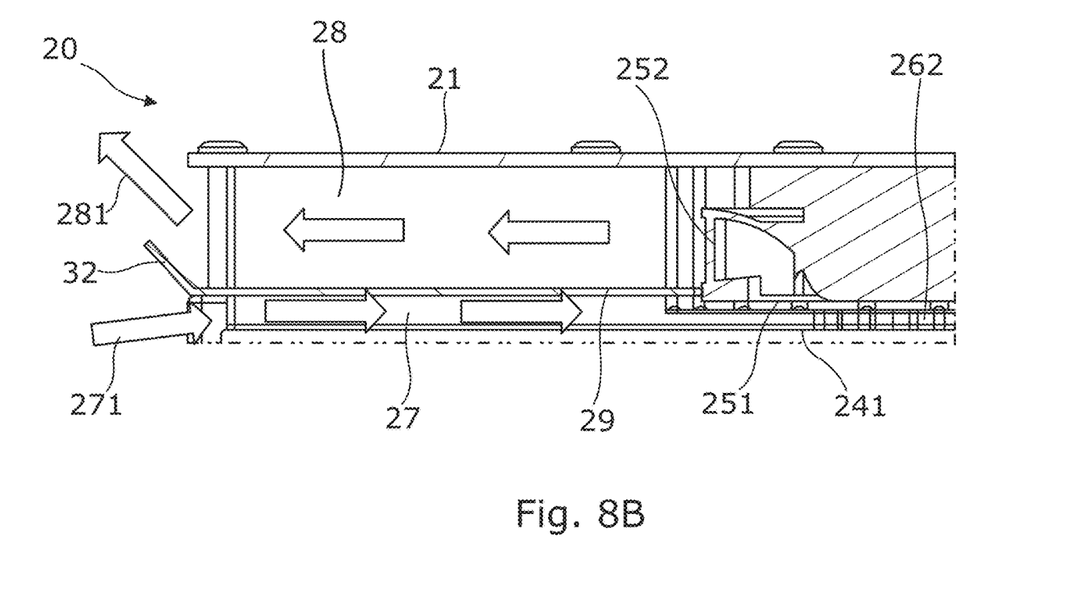
FIG. 8B shows a cross-sectional view of the airflow channels within the heatsink assembly shown in FIG. 8A.

FIG. 8B shows a cross-sectional view through a portion of the heatsink assembly 20. As shown, the baffle 29 extends from the periphery of the assembly to the fan aperture 31, from where it abuts against the outer body of the fan 25 between the fan inlet 251 at the bottom of the fan and the fan outlet 252 at the side of the fan. The fan inlet 251 is thereby in fluid communication with the inlet airflow channel 27 and the fan outlet 252 is in fluid communication with the outlet airflow channel 28.

When activated, the fan 25 drives air through an airflow path defined by the inlet and outlet channels 27, 28, thereby pulling in air from the surroundings of the heatsink assembly 20 over the cooling surface of the heatsink. The intake air is therefore heated has it passes between the fins 26 and over the heatsink base 241, thereby cooling the heatsink 24. The warmed air enters the centrifugal fan 25 and is pushed out through the outlet channels 28, further cooling the cooling fins 26 before being expelled.

With the above arrangement, the orientation of the centrifugal fan 25 is upside-down from that used in conventional arrangements. As such, the fan 25 is supported above the heatsink base 241 by the cover 21, thereby allowing the inlet air stream 271 to extend over the entire cooling surface. That is, the central region of the heatsink 24 is not lost to the space needed to mount the fan 25 and airflow is driven over the central clearing 242 below the fan 25 by the negative pressure generated by the impeller. The short projections 262 also help to maximize the surface area for heat transfer in this region. Accordingly, the arrangement provides for a larger surface area for cooling compared to conventional arrangements.

A further benefit of the above arrangement is, because the fan is mounted to the cover 21, the heat dissipated by its motor during operation is not directly transferred to the electronics housing. This separation thereby provides for an overall improvement in the cooling system performance. At the same time, because the fan 25 draws in air from the side, the cover 21 does not require an inlet aperture, as is needed in conventional arrangements. This thereby avoids the conventional requirement for an air gap to be provided above the cover 21 when the assembly is fitted. This provides greater flexibility in terms of where the controller may be installed and allows cooling assemblies with taller fins to be employed than might otherwise be possible.

Accordingly, an improved cooling device may be provided which can allow for both greater cooling efficiency and installation flexibility. Consequently, an improved cooling device for an automotive controller may be provided for maintaining the operational temperature of sensitive electronic components.

It will be understood that the embodiments illustrated above show applications only for the purposes of illustration. In practice, embodiments may be applied to many different configurations, the detailed embodiments being straightforward for those skilled in the art to implement.

What is claimed is:

1. A cooling device for cooling a heatsink having a plurality of cooling fins provided on a heatsink base, the cooling device comprising:
   a centrifugal fan having a fan inlet and a fan outlet;
   a support for mounting the centrifugal fan above the heatsink base; and
   a baffle comprising:
      an aperture into which the centrifugal fan is received such that the baffle is located between the fan inlet and the fan outlet; and
      a plate having a plurality of cut-outs configured for receiving the plurality of cooling fins of the heatsink such that the baffle is locatable between the support and the heatsink base, the baffle defining an inlet pathway configured for feeding air between the cooling fins over the heatsink base to the fan inlet, and the baffle defining an outlet pathway configured for expelling air from the fan outlet, an outer periphery of the plate comprising:
         three integrally formed airflow guides that each extend beyond three corresponding outer side edges of the heat sink base and each of the integrally formed airflow guides form a bend in the plate that extends upward so that each airflow guide has an inclined face relative to a remainder of the plate for directing air from the outlet pathway away from the inlet pathway, and
         a recess formed in a fourth outer side edge of the plate configured to fit around a cable terminal access.

2. The cooling device according to claim 1, wherein the heatsink forms a housing for an electronic controller.

3. The cooling device according to claim 1, wherein the cut-outs are shaped for seating onto seating formations provided on the cooling fins for supporting the baffle.

4. The cooling device according to claim 1, wherein the cut-outs are shaped for forming a press-fit interface against the cooling fins for securing the baffle to the cooling fins.

5. The cooling device according to claim 1, wherein the support further comprises:
   a planar mounting surface, wherein the centrifugal fan is mounted to the planar mounting surface such that the fan inlet is positioned distally to the support.

6. The cooling device according to claim 1, wherein the inlet pathway comprises a plurality of channels.

7. The cooling device according to claim 1, wherein the outlet pathway comprises a plurality of channels.

8. The cooling device according to claim 1, further comprising:
   the heatsink comprising:
      the heatsink base; and
      the plurality of cooling fins provided on the heatsink base.

9. The cooling device according to claim 8, wherein the plurality of cooling fins are received in the plurality of cut-outs such that the baffle is located between the support and the heatsink base, the baffle defining the inlet pathway and the outlet pathway.

10. The cooling device according to claim 9, wherein the heatsink base comprises a cooling surface.

11. The cooling device according to claim 10, wherein the plurality of cooling fins project perpendicular to the cooling surface.

12. The cooling device according to claim 11, wherein the baffle and the support are located in planes parallel to the cooling surface.

13. The cooling device according to claim 9, wherein the plurality of cooling fins comprise a reduced height region into which the centrifugal fan is received.

14. The cooling device according to claim 9, wherein the support engages with an apex of one or more of the plurality of cooling fins.

15. The cooling device according to claim 9, wherein the plurality of cooling fins comprise seating formations for supporting the baffle.

16. The cooling device according to claim 9, wherein the baffle is secured to the cooling fins by a heat-conductive adhesive.

17. The cooling device according to claim 9, wherein the baffle is secured to the cooling fins by a press-fit engagement.

18. The cooling device according to claim 1,
   wherein the heatsink further comprises:
      the heatsink base;
      a cooling surface; and
      the plurality of cooling fins provided on the heatsink base projecting perpendicular to the cooling surface,
   wherein the plurality of cooling fins is received in the plurality of cut-outs such that the baffle is located between the support and the heatsink base, the baffle defining the inlet pathway and the outlet pathway,
   wherein the heatsink base comprises the cooling surface,
   wherein the cooling fins project perpendicular to the cooling surface, and
   wherein the baffle and the support are located in planes parallel to the cooling surface.

19. Cooling device according to claim 1, wherein the cooling fins are elongated in a radial direction extending from a center region beneath the centrifugal fan toward an outer edge of the heat sink base, wherein the center of the heat sink beneath the centrifugal fan is provided with a plurality of round projections.

* * * * *

UNITED STATES PATENT AND TRADEMARK OFFICE
CERTIFICATE OF CORRECTION

PATENT NO. : 12,185,493 B2  
APPLICATION NO. : 17/662991  
DATED : December 31, 2024  
INVENTOR(S) : Jakub Korta et al.

Page 1 of 1

It is certified that error appears in the above-identified patent and that said Letters Patent is hereby corrected as shown below:

In the Claims

Column 8, Claim 19, Line 49: delete "Cooling" and insert --The cooling-- therefor Signed and Sealed this  
Fifteenth Day of April, 2025

Coke Morgan Stewart  
*Acting Director of the United States Patent and Trademark Office*